US008885276B2

(12) United States Patent
Yang et al.

(10) Patent No.: US 8,885,276 B2
(45) Date of Patent: Nov. 11, 2014

(54) SYSTEMS AND METHODS FOR SHARED LAYER DATA DECODING

(71) Applicant: LSI Corporation, Milpitas, CA (US)

(72) Inventors: Shaohua Yang, San Jose, CA (US); Chung-Li Wang, San Jose, CA (US); Anatoli Bolotov, San Jose, CA (US); Bruce A. Wilson, San Jose (CA)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/766,911

(22) Filed: Feb. 14, 2013

(65) Prior Publication Data

US 2014/0226229 A1    Aug. 14, 2014

(51) Int. Cl.
*G11B 20/10*    (2006.01)
*H03M 7/00*    (2006.01)

(52) U.S. Cl.
CPC ...................................... *H03M 7/00* (2013.01)
USPC ............. 360/39; 360/32; 341/50; 369/124.04

(58) Field of Classification Search
None
See application file for complete search history.

(56) References Cited

U.S. PATENT DOCUMENTS

| | | |
|---|---|---|
| 4,553,221 A | 11/1985 | Hyatt |
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |

(Continued)

FOREIGN PATENT DOCUMENTS

| | | |
|---|---|---|
| JP | 2001/319433 A | 11/2001 |
| WO | WO 2010/059264 A1 | 5/2010 |
| WO | WO 2010/126482 A1 | 11/2010 |

OTHER PUBLICATIONS

U.S. Appl. No. 13/426,714, filed Mar. 22, 2012, Shaohua Yang.

(Continued)

*Primary Examiner* — Thang Tran
(74) *Attorney, Agent, or Firm* — Hamilton DeSanctis & Cha

(57) ABSTRACT

The present inventions are related to systems and methods for data processing, and more particularly to systems and methods for performing data decoding.

20 Claims, 10 Drawing Sheets

(56) References Cited

U.S. PATENT DOCUMENTS

| | | | |
|---|---|---|---|
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,412,088 B1 | 6/2002 | Patapoutian et al. | |
| 6,473,878 B1 | 10/2002 | Wei | |
| 6,535,553 B1 | 3/2003 | Limberg et al. | |
| 6,625,775 B1 | 9/2003 | Kim | |
| 6,643,814 B1* | 11/2003 | Cideciyan et al. | 714/755 |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,975,692 B2 | 12/2005 | Razzell | |
| 6,986,098 B2 | 1/2006 | Poeppelman | |
| 7,035,327 B2 | 4/2006 | Nakajima et al. | |
| 7,047,474 B2 | 5/2006 | Rhee | |
| 7,058,853 B1 | 6/2006 | Kavanappillil et al. | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,136,244 B1 | 11/2006 | Rothberg | |
| 7,184,486 B1 | 2/2007 | Wu | |
| 7,191,378 B2 | 3/2007 | Eroz | |
| 7,203,887 B2 | 4/2007 | Eroz | |
| 7,237,181 B2 | 6/2007 | Richardson | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,596,196 B1 | 9/2009 | Liu et al. | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Vila Casado et al. | |
| 7,952,824 B2 | 5/2011 | Dziak | |
| 7,958,425 B2 | 6/2011 | Chugg | |
| 7,958,426 B2* | 6/2011 | Betts | 714/755 |
| 7,996,746 B2 | 8/2011 | Livshitz | |
| 8,018,360 B2 | 9/2011 | Nayak | |
| 8,020,078 B2 | 9/2011 | Richardson | |
| 8,161,361 B1 | 4/2012 | Song et al. | |
| 8,201,051 B2 | 6/2012 | Tan | |
| 8,225,168 B2 | 7/2012 | Yu et al. | |
| 8,237,597 B2 | 8/2012 | Liu | |
| 8,261,171 B2 | 9/2012 | Annampedu | |
| 8,291,284 B2 | 10/2012 | Savin | |
| 8,291,299 B2 | 10/2012 | Li | |
| 8,295,001 B2 | 10/2012 | Liu | |
| 2001/0050622 A1* | 12/2001 | Hewitt et al. | 341/50 |
| 2002/0067780 A1 | 6/2002 | Razzell | |
| 2003/0021355 A1* | 1/2003 | You | 375/267 |
| 2003/0123364 A1 | 7/2003 | Nakajima et al. | |
| 2003/0147168 A1 | 8/2003 | Galbraith et al. | |
| 2004/0194007 A1 | 9/2004 | Hocevar | |
| 2005/0066261 A1* | 3/2005 | Morita et al. | 714/800 |
| 2005/0243456 A1 | 11/2005 | Mitchell et al. | |
| 2006/0002689 A1 | 1/2006 | Yang et al. | |
| 2007/0041461 A1* | 2/2007 | Lu et al. | 375/261 |
| 2007/0124657 A1* | 5/2007 | Orio | 714/794 |
| 2007/0297496 A1 | 12/2007 | Park et al. | |
| 2008/0037676 A1 | 2/2008 | Kyung et al. | |
| 2008/0069373 A1 | 3/2008 | Jiang | |
| 2008/0304558 A1 | 12/2008 | Zhu et al. | |
| 2009/0132893 A1* | 5/2009 | Miyazaki et al. | 714/776 |
| 2009/0177852 A1 | 7/2009 | Chen | |
| 2009/0185643 A1 | 7/2009 | Fitzpatrick | |
| 2010/0172046 A1 | 7/2010 | Liu et al. | |
| 2010/0322048 A1 | 12/2010 | Yang et al. | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |
| 2013/0132796 A1* | 5/2013 | Vummintala et al. | 714/758 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Richardson, T "Error Floors of LDPC Codes" Flarion Technologies Bedminster NJ 07921, tjr@flarion.com (not dated).

Shokrollahi "LDPC Codes: An Introduction", Digital Fountain, Inc. (Apr. 2, 2003).

Spagnol et al, "Hardware Implementation of GF($2^m$) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

(56) References Cited

OTHER PUBLICATIONS

Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/296,022, filed Nov. 14, 2011, Victor Krachkovsky, Unpublished.
U.S. Appl. No. 13/239,683, filed Sep. 22, 2011, Changyou Xu, Unpublished.
U.S. Appl. No. 13/186,234, filed Jul. 19, 2011, Haitao Xia, Unpublished.
U.S. Appl. No. 13/746,301, filed Jan. 21, 2013, Shu Li, Unpublished.
U.S. Appl. No. 13/283,549, filed Oct. 27, 2011, Wu Chang, Unpublished.
U.S. Appl. No. 13/300,078, filed Nov. 18, 2011, Chung-Li Wang, Unpublished.
U.S. Appl. No. 13/302,119, filed Nov. 22, 2011, Lei Chen, Unpublished.
U.S. Appl. No. 13/305,510, filed Nov. 28, 2011, Lei Chen, Unpublished.
U.S. Appl. No. 13/305,551, filed Nov. 28, 2011, Yang Han, Unpublished.
U.S. Appl. No. 13/174,537, filed Jun. 30, 2011, Anantha Raman Krishnan, Unpublished.
U.S. Appl. No. 13/174,453, filed Jun. 30, 2011, Johnson Yen, Unpublished.
U.S. Appl. No. 13/171,615, filed Jun. 29, 2011, Bradley D. Seago, Unpublished.
U.S. Appl. No. 13/113,219, filed May 23, 2011, Yang Han, Unpublished.
U.S. Appl. No. 13/227,544, filed Sep. 8, 2011, Shaohua Yang, Unpublished.
U.S. Appl. No. 13/213,751, filed Aug. 19, 2011, Fan Zhang, Unpublished.
U.S. Appl. No. 13/227,416, filed Sep. 7, 2011, Lei Chen, Unpublished.
U.S. Appl. No. 13/415,430, filed Mar. 8, 2012, Nayak Ratnakar Aravind, Unpublished.
U.S. Appl. No. 13/545,833, filed Jul. 10, 2012, Zhi Bin Li, Unpublished.
U.S. Appl. No. 13/269,832, filed Nov. 10, 2011, Haitao Xia, Unpublished.
U.S. Appl. No. 13/596,947, filed Aug. 28, 2012, Fan Zhang, Unpublished.
U.S. Appl. No. 13/180,495, filed Jul. 11, 2011, Chung-Li Wang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/433,693, filed Mar. 29, 2012, Fan Zhang, Unpublished.
U.S. Appl. No. 13/621,341, filed Sep. 17, 2012, Shaohua Yang, Unpublished.
U.S. Appl. No. 13/596,819, filed Aug. 28, 2012, Shaohua Yang, Unpublished.
U.S. Appl. No. 13/415,326, filed Mar. 8, 2012, Shaohua Yang, Unpublished.
U.S. Appl. No. 13/989,583, filed Oct. 15, 2012, Shaohua Yang, Unpublished.
U.S. Appl. No. 13/483,100, filed May 30, 2012, Fan Zhang, Unpublished.
U.S. Appl. No. 13/483,105, filed May 30, 2012, Xuebin Wu, Unpublished.
U.S. Appl. No. 13/426,693, filed Mar. 22, 2012, Shaohua Yang, Unpublished.
U.S. Appl. No. 13/705,407, filed Dec. 5, 2012, Lingyan Sun, Unpublished.
U.S. Appl. No. 13/652,012, filed Oct. 15, 2012, Fan Zhang, Unpublished.
U.S. Appl. No. 13/619,907, filed Sep. 14, 2012, Fan Zhang, Unpublished.
U.S. Appl. No. 13/284,730, filed Oct. 28, 2011, Fan Zhang, Unpublished.
U.S. Appl. No. 13/316,741, filed Dec. 12, 2011, Yang Han, Unpublished.
U.S. Appl. No. 13/327,279, filed Dec. 15, 2011, Wei Feng, Unpublished.
U.S. Appl. No. 13/340,974, filed Dec. 30, 2011, Dan Liu, Unpublished.
U.S. Appl. No. 13/474,660, filed May 17, 2012, Zongwang Li, Unpublished.
U.S. Appl. No. 13/445,848, filed Apr. 12, 2012, Bruce Wilson, Unpublished.
U.S. Appl. No. 13/340,951, filed Dec. 30, 2011, Lei Chen, Unpublished.
U.S. Appl. No. 13/445,878, filed Apr. 12, 2012, Yu Liao, Unpublished.
U.S. Appl. No. 13/269,852, filed Oct. 10, 2011, Haitao Xia, Unpublished.
U.S. Appl. No. 13/316,858, filed Dec. 12, 2011, Zongwang Li, Unpublished.
U.S. Appl. No. 13/295,150, filed Nov. 14, 2011, Zongwang Li, Unpublished.
U.S. Appl. No. 13/362,409, filed Jan. 31, 2012, Fan Zhang, Unpublished.
U.S. Appl. No. 13/412,520, filed Mar. 5, 2012, Fan Zhang, Unpublished.
U.S. Appl. No. 13/426,714, filed Mar. 22, 2012, Shaohua Yang, Unpublished.
U.S. Appl. No. 13/372,580, filed Feb. 14, 2012, Fan Zhang, Unpublished.
U.S. Appl. No. 13/422,986, filed Mar. 16, 2012, Fan Zhang, Unpublished.
U.S. Appl. No. 13/284,767, filed Oct. 28, 2011, Fan Zhang, Unpublished.
U.S. Appl. No. 13/369,468, filed Feb. 9, 2012, Zongwang Li, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

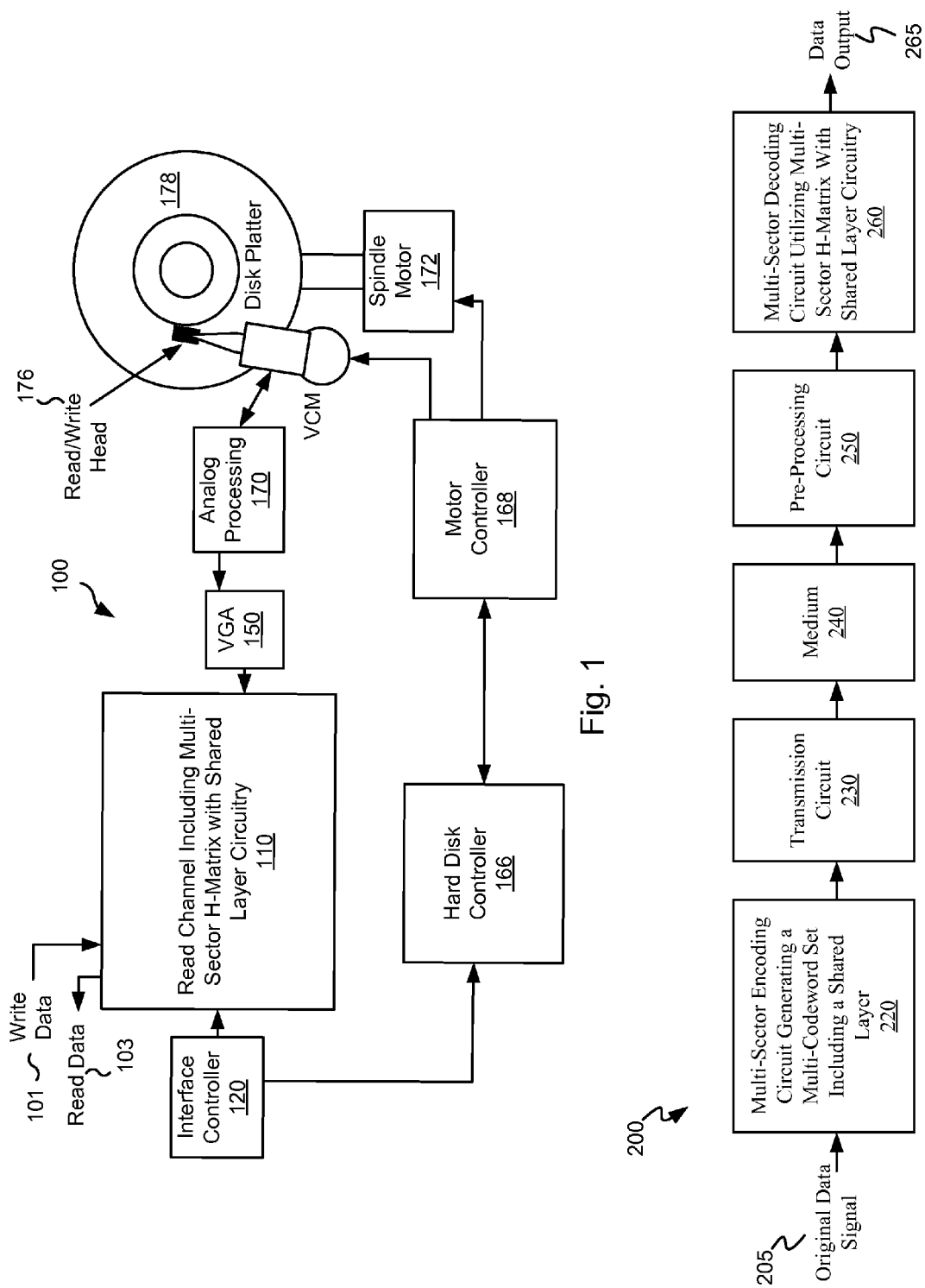

US 8,885,276 B2

SYSTEMS AND METHODS FOR SHARED LAYER DATA DECODING

FIELD OF THE INVENTION

The present inventions are related to systems and methods for data processing, and more particularly to systems and methods for performing data decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. In some cases, data decoding fails to properly decode.

Hence, for at least the aforementioned reasons, there exists a need in the art for advanced systems and methods for data decoding.

BRIEF SUMMARY

The present inventions are related to systems and methods for data processing, and more particularly to systems and methods for performing data decoding Some embodiments of the present invention provide data processing systems that include one or both of a data encoder circuit and a data decoder circuit. The data encoder circuit is operable to: receive a data input that includes at least a first data set and a second data set, and encode the data set to yield a first encoded output and a second encoded output. The first encoded output includes the first data set and a first encoded data, the second encoded output includes the second data set and a second encoded data, and the first encoded data and the second encoded data are generated from a combination of the first data set and the second data set. The data encoder circuit is further operable to: encode the first encoded output to yield a first codeword where the first codeword includes the first encoded output and a third encoded data unrelated to the second encoded output, and to encode the second encoded output to yield a second codeword where the second codeword includes the second encoded output and a fourth encoded data unrelated to the first encoded output. The data decoder circuit is operable to: decode the first codeword to yield a third encoded output and a fifth encoded data, and decode the second codeword to yield a fourth encoded output and a sixth encoded data. Where the third encoded output is different from the first encoded output, the data decoder circuit is further operable to: generate a first feedback based at least in part upon the third encoded output and the fourth encoded output, and re-decode the first codeword using the first feedback as a guide.

This summary provides only a general outline of some embodiments of the invention. The phrases "in one embodiment," "according to one embodiment," "in various embodiments", "one or more embodiments", "particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 shows a data processing circuit including multi-sector H-matrix with shared layer circuitry in accordance with one or more embodiments of the present invention;

DETAILED DESCRIPTION OF THE INVENTION

Figure 2B:
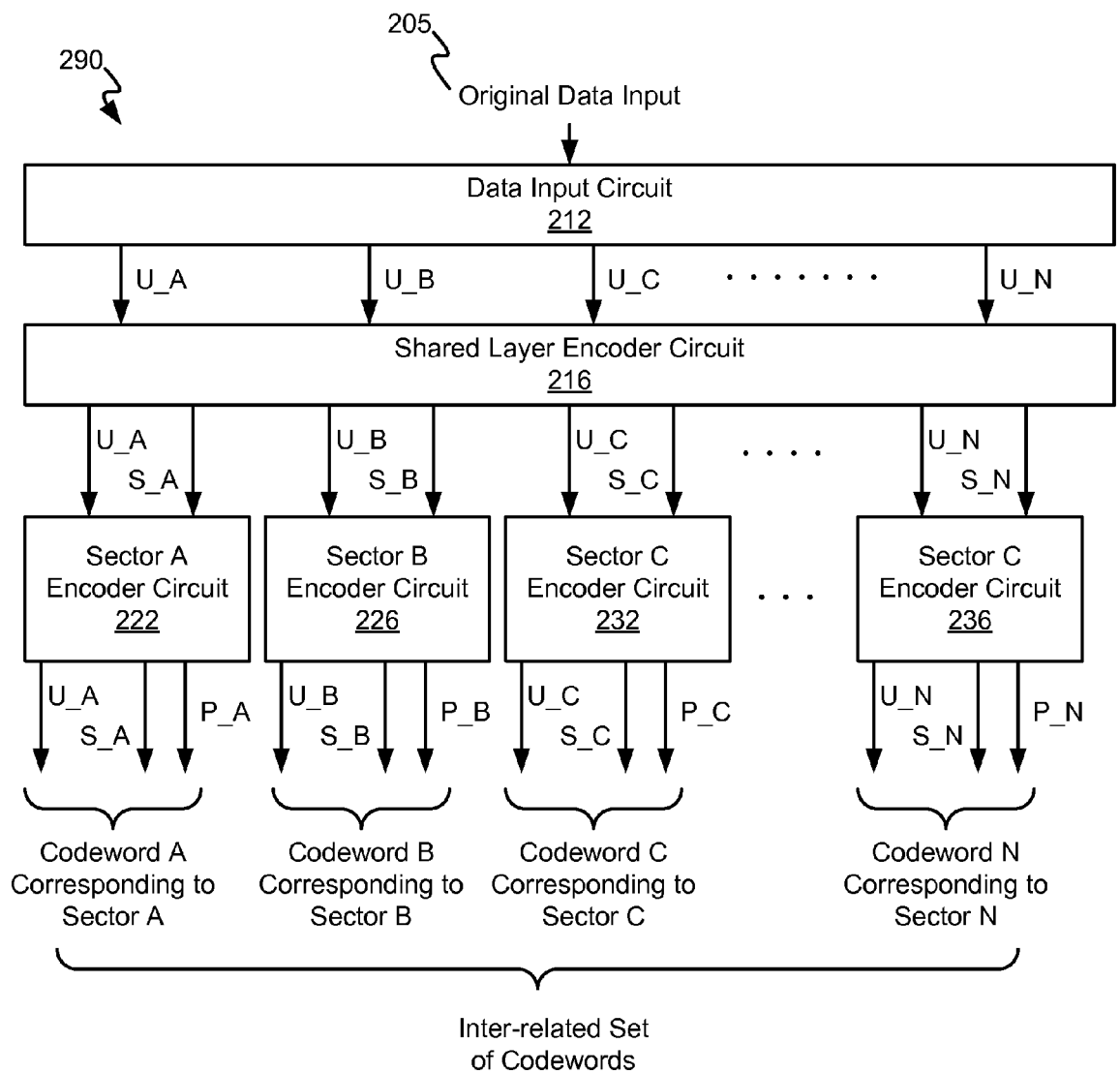
FIG. 2a depicts a data processing system relying on multi-sector H-matrix with shared layer circuitry in accordance with various embodiments of the present invention FIG. 2b graphically depicts a process for generating a multi-sector codeword set that may be used in relation to embodiments of the present invention.

The present inventions are related to systems and methods for data processing, and more particularly to systems and methods for performing data decoding.

Some embodiments of the present invention provide data processing systems that include a data encoder circuit and a data decoder circuit. The data encoder circuit is operable to: receive a data input that includes at least a first data set and a second data set, and encode the data set to yield a first encoded output and a second encoded output. The first encoded output includes the first data set and a first encoded data, the second encoded output includes the second data set and a second encoded data, and the first encoded data and the second encoded data are generated from a combination of the first data set and the second data set. The data encoder circuit is further operable to: encode the first encoded output to yield a first codeword where the first codeword includes the first encoded output and a third encoded data unrelated to the second encoded output, and to encode the second encoded output to yield a second codeword where the second codeword includes the second encoded output and a fourth encoded data unrelated to the first encoded output. The data decoder circuit is operable to: decode the first codeword to yield a third encoded output and a fifth encoded data, and decode the second codeword to yield a fourth encoded output and a sixth encoded data. Where the third encoded output is different from the first encoded output, the data decoder circuit is further operable to: generate a first feedback based at least in part upon the third encoded output and the fourth encoded output, and re-decode the first codeword using the first feedback as a guide.

In one or more embodiments of the present invention, the data processing system includes a data encoder circuit operable to: receive a data input that includes at least a first data set and a second data set, and encode the data set to yield a first encoded output and a second encoded output. The first encoded output includes the first data set and a first encoded data, the second encoded output includes the second data set and a second encoded data, and the first encoded data and the second encoded data are generated from a combination of the first data set and the second data set. The encoder circuit is further operable to encode the first encoded output to yield a first codeword where the first codeword includes the first encoded output and a third encoded data unrelated to the second encoded output, and encode the second encoded output to yield a second codeword where the second codeword includes the second encoded output and a fourth encoded data unrelated to the first encoded output. In some instances of the aforementioned embodiments, the first encoded data is parity data is a first parity data and the second encoded data is a second parity data where both the first parity data and the second parity data are generated based upon a combination of the first data set and the second data set.

Other embodiments of the present invention provide data processing systems that include a data decoder circuit operable to: apply a data decode algorithm to a first codeword to yield a first encoded output and a first encoded data, and apply the data decode algorithm to a second codeword to yield a second encoded output and a second encoded data. Where the first encoded output includes an uncorrected error, the data decoder circuit is further operable to: generate a first feedback based at least in part upon both the first encoded output and the second encoded output, and re-decode the first codeword using the first feedback as a guide to correct the uncorrected error. The first encoded output includes a first data set and a third encoded data, and the second encoded output includes a second data set and a fourth encoded output. The third encoded data and the fourth encoded data are generated based upon an input data set including at least the first data set and the second data set.

In some instances of the aforementioned embodiments, generating the first feedback includes: calculating an overall syndrome value based at least in part upon both the first encoded output and the second encoded output; and calculating a codeword specific syndrome value by XORing a partial syndrome resulting from applying the data decode algorithm to the first codeword with the overall syndrome value. In such instances, the first feedback includes the codeword specific syndrome value. In various instances of the aforementioned embodiments, generating the first feedback includes generating a cumulative minimum value based at least in part upon both the first encoded output and the second encoded output, and selecting either a first minimum of the cumulative minimum value or a second minimum of the cumulative minimum value as a codeword minimum based at least in part on an equivalence between a decoder minimum resulting from applying the data decode algorithm to the first codeword is equivalent to the first minimum of the cumulative minimum value. In such cases, the first feedback includes the codeword minimum.

In various instances of the aforementioned embodiments, the data processing system is implemented as part of a storage device, wherein the storage device includes: a storage medium operable to maintain information representing both the first codeword and the second codeword; a head assembly disposed in relation to the storage medium and operable to provide a sensed signal corresponding to the information on the storage medium; and a read channel circuit. The read channel circuit includes: an analog to digital converter circuit operable to sample an analog signal derived from the sensed signal to yield a series of digital samples; an equalizer circuit operable to equalize the digital samples to yield the first codeword and the second codeword; and an input buffer operable to maintain at least the first codeword and the second codeword. In some cases, the storage device further includes: a data encoder circuit operable to: receive a data input that includes at least a first data set and a second data set, and to encode the data set to yield a third encoded output and a fourth encoded output. The third encoded output includes the first data set and a first encoded data, the fourth encoded output includes the second data set and a second encoded data, and the first encoded data and the second encoded data are generated from a combination of the first data set and the second data set. The encoder circuit is further operable to: encode the third encoded output to yield the first codeword where the first codeword includes the third encoded output and a third encoded data unrelated to the fourth encoded output; and encode the fourth encoded output to yield the second codeword where the second codeword includes the fourth encoded output and a fourth encoded data unrelated to the third encoded output.

Turning to FIG. 1, a storage system 100 including a read channel circuit 110 that includes multi-sector H-matrix with shared layer circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

Writing data to disk platter 178 includes applying multi-sector encoding to generate a multi-codeword set including a shared layer. Such multi-sector encoding may be done, for example, in accordance with that discussed below in relation to FIG. 2b. The multi-codeword sets are written to disk platter 178. When desired, the multi-codeword sets are accessed from disk platter 178 and processed using a data processing circuit including multi-sector H-matrix with shared layer circuitry. Such a data processing circuit may be implemented similar to that discussed below in relation to FIG. 4. The multi-sector H-matrix with shared layer circuitry may operate as described in relation to FIGS. 5a-5d. Further, data decoding including multi-sector H-matrix with shared layer processing may be implemented as described below in relation to FIGS. 6a-6b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 3A:
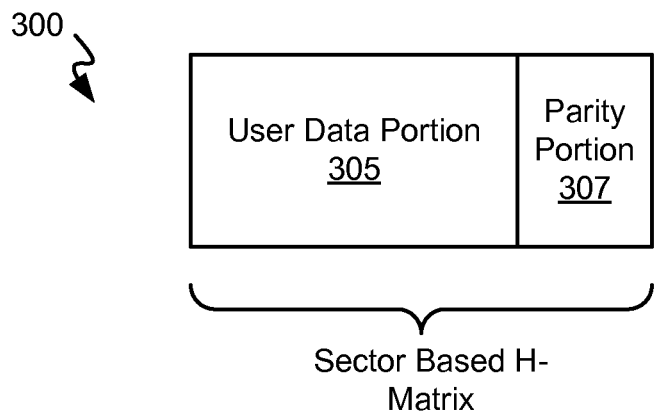
FIGS. 3a-3b graphically depict a sector based H-matrix, and a multi-sector codeword formed as a number of sector based H-matrices and a common shared layer in accordance with one or more embodiments of the present invention.
Figure 3B:
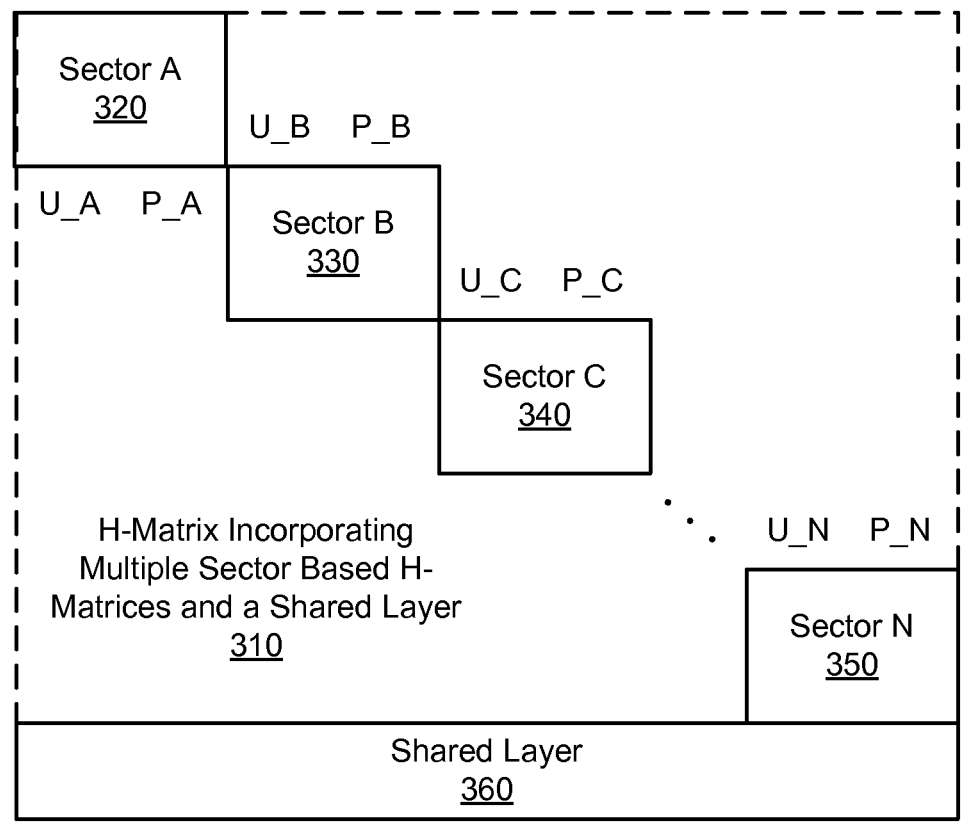

FIGS. 3a-3b graphically depict a sector based H-matrix, and a multi-sector codeword formed as a number of sector based H-matrices and a common shared layer in accordance with one or more embodiments of the present invention. Referring to FIG. 3a, a sector based H-matrix 300 is shown. Such a sector based H-matrix is simply a traditionally encoded codeword including a user data portion 305 and a parity portion 307. Parity portion 307 includes a number of parity bits calculated during an encoding process based upon user data portion 305. FIG. 3b graphically represents a multi-sector codeword 310 is encoded to include a number of sector base H-matrices 320, 330, 340, 350 (Sector A, Sector B, Sector C and Sector N) each including user data (U_A, U_B, U_C and U_N) and parity data (P_A, P_B, P_C and P_N). Multi-sector codeword 310 is additionally included to include a shared layer 360 that includes encoding usable across multiple of the sector based H-matrices 320, 330, 340, 350. It should be noted that FIG. 3b is a graphical representation showing the components (e.g., U_A, P_P and shared layer) in distinct physical locations relative to one another, but that portions of each of the components may be intermixed in some cases.

Turning to FIG. 2a, a data processing system 200 relying on multi-sector H-matrix with shared layer circuitry is shown in accordance with various embodiments of the present invention. Data processing system 200 includes a multi-sector encoding circuit 220 that generates a multi-codeword set including a shared layer. The encoding is applied to an original data signal 205 that includes multiple sectors of data that are encoded together by multi-sector encoding circuit 220 to yield a corresponding multi-codeword set including a shared layer as an output to a transmission circuit 230. Original input 205 may be any set of input data. For example, where data processing system 200 is a hard disk drive, original input 205 may be a data set that is destined for storage on a storage medium. In such cases, a medium 240 of data processing system 200 is a storage medium. As another example, where data processing system 200 is a communication system, original input 205 may be a data set that is destined to be transferred to a receiver via a transfer medium. Such transfer mediums may be, but are not limited to, wired or wireless transfer mediums. In such cases, a medium 240 of data processing system 200 is a transfer medium.

Turning to FIG. 2b, a graphical depiction 290 representing operation of encoding circuit 220 is provided. In particular, original data 205 is received by a data input circuit 212 that divides original data input 205 into a number of subsets of data labeled as U_A, U_B, U_C and U_N. In some particular embodiments of the present invention, each of the aforementioned subsets of data are a single sector of data derived from a storage medium. Based upon the disclosure provided herein, one of ordinary skill in the art will recognize other subsets that may be used in relation to different embodiments of the present invention. It should be noted that while the graphical depiction 290 shows four subsets of data (U_A, U_B, U_C and U_N) that more or fewer subsets may be used in accordance with different embodiments of the present invention.

The aforementioned subsets of data are provided to a shared layer encoder circuit 216. Shared layer encoder circuit 216 applies an encoding algorithm to the combination of subsets of data to yield an encoded data set (e.g., a combination of S_A, S_B, S_C and S_N). This encoded data set corresponds to shared layer 360 described above in relation to FIG. 3b, and results in a defined syndrome for the overall combination of data U_A, S_A, U_B, S_B, U_C, S_C, U_N and S_N. This syndrome can be used during the decoding process to correct errors. The encoded data set (the combination of S_A, S_B, S_C and S_N) may be spread across the overall data set. As shown in this particular example, portions of the encoded data set are incorporated into each of the respective subsets of data (i.e., S_A incorporated with U_A to make a first sector data set (U_A+S_A), S_B incorporated with U_B to make a second sector data set (U_B+S_B), S_A incorporated with U_C to make a third sector data set (U_C+S_C), and S_N incorporated with U_N to make a fourth sector data set (U_N+S_N)). The encoding applied by shared layer encoder circuit may be any encoding known in the art including, but not limited to, an encoding that adds one or more parity bits.

Each of the aforementioned sector data sets are provided to respective sector encoder circuits that apply an encoding algorithm based upon a defined G-matrix for that sector. In particular, the first sector data set (U_A+S_A) is provided to a sector A encoder circuit 222 that applies an encoding algorithm using a defined G-matrix to generate parity bits (P_A) that are incorporated with the first sector data set to yield a codeword A that corresponds to the subset of data labeled as U_A (i.e., U_A+S_A+P_A). The second sector data set (U_B+S_B) is provided to a sector B encoder circuit 226 that applies an encoding algorithm using a defined G-matrix to generate parity bits (P_B) that are incorporated with the second sector data set to yield a codeword B that corresponds to the subset of data labeled as U_B (i.e., U_B+S_B+P_B). The third sector data set (U_C+S_C) is provided to a sector C encoder circuit 232 that applies an encoding algorithm using a defined G-matrix to generate parity bits (P_C) that are incorporated with the third sector data set to yield a codeword C that corresponds to the subset of data labeled as U_C (i.e., U_C+S_C+P_C). The fourth sector data set (U_N+S_N) is provided to a sector N encoder circuit 236 that applies an encoding algorithm using a defined G-matrix to generate parity bits (P_N) that are incorporated with the fourth sector data set to yield a codeword N that corresponds to the subset of data labeled as U_N (i.e., U_N+S_N+P_N). All of codeword A, codeword B, codeword C and codeword N represent an inter-related set of codewords linked together by the combination of S_A, S_B, S_C and S_N that corresponds to shared layer 360.

Returning to FIG. 2a, encoding circuit 220 provides the inter-related set of codewords to a transmission circuit 230. Transmission circuit 230 may be any circuit known in the art that is capable of transferring the received codeword 225 via medium 240. Thus, for example, where data processing circuit 200 is part of a hard disk drive, transmission circuit 230 may include a read/write head assembly that converts an electrical signal into a series of magnetic signals appropriate for writing to a storage medium. Alternatively, where data processing circuit 200 is part of a wireless communication system, transmission circuit 230 may include a wireless transmitter that converts an electrical signal into a radio frequency signal appropriate for transmission via a wireless transmission medium. Transmission circuit 230 provides a transmission output to medium 240. Medium 240 provides a transmitted input that is the transmission output augmented with one or more errors introduced by the transference across medium 240.

Data processing circuit 200 includes a pre-processing circuit 250 that applies one or more analog functions to the transmitted input. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 250 provides a pre-processed output to a decoding circuit 260. Decoding circuit 260 includes decoding circuitry capable of utilizing the encoding applied both in the shared layer encoding and the sector encoding. Decoding circuit 260 provides a data output 265. Of note, the parity check matrix used in encoding circuit 220 is often referred to as the generation matrix or G-matrix, and is the inverse of the parity check matrix used in decoding circuit 260 that is often referred to as the H-matrix.

Figure 4:
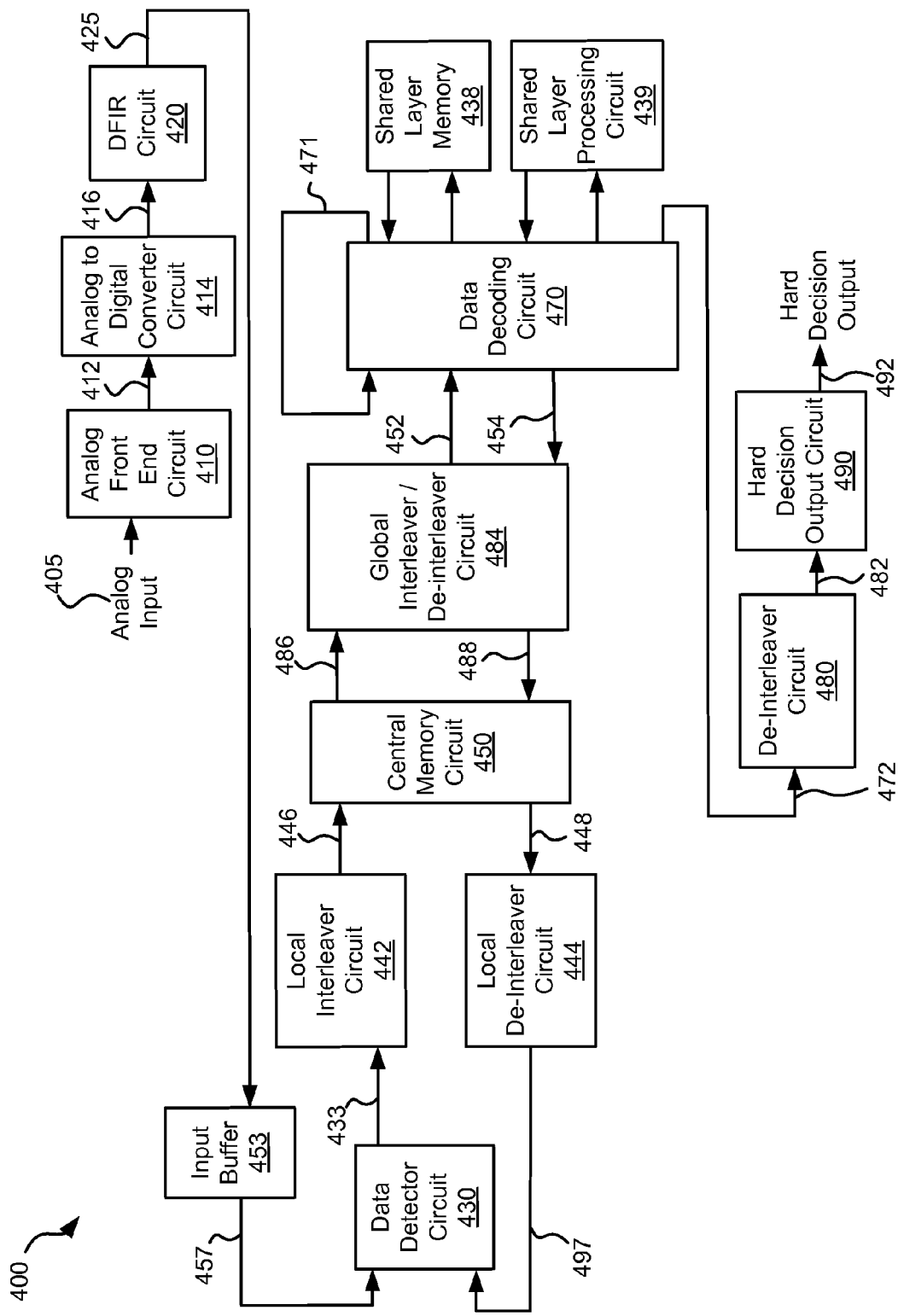
FIG. 4 depicts a data processing circuit including multi-sector H-matrix with shared layer circuitry in accordance with some embodiments of the present invention.

Turning to FIG. 4, a data processing circuit 400 including depicts a data processing circuit including multi-sector H-matrix with shared layer circuitry in accordance with some embodiments of the present invention. Data processing circuit 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. Analog signal 405 represents an inter-related set of codewords that may be similar to that described above in relation to FIG. 2b where a number of subset data sets are inter-related by a shared layer. In some cases, where data processing circuit 400 is implemented as part of a storage device, analog signal 405 is derived from a read/write head assembly (not shown) that is disposed in relation to a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter (DFIR) circuit as are known in the art. It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input. Equalized output 425 is stored to an input buffer 453 that includes sufficient memory to maintain one or more codewords until processing of that codeword is completed through a data detector circuit 430 and a data decoding circuit 470 including, where warranted, multiple global iterations (passes through both data detector circuit 430 and data decoding circuit 470) and/or local iterations (passes through data decoding circuit 470 during a given global iteration). An output 457 is provided to data detector circuit 430.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Each instance of detector output 433 corresponds to a respective one of the codewords within the inter-related set of codewords received as analog input 405.

Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once a data decoding circuit 470 is available, a previously stored interleaved codeword 446 is accessed from central memory circuit 450 as a stored codeword 486 and globally interleaved by a global interleaver/de-interleaver circuit 484. Global interleaver/De-interleaver circuit 484 may be any circuit known in the art that is capable of globally rearranging codewords. Global interleaver/De-interleaver circuit 484 provides a decoder input 452 into data decoding circuit 470. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 470 applies a data decode algorithm to decoder input 452 to yield a decoded output 471. The data decode algorithm is applied to decoder inputs 452 that each correspond to a respective one of the codewords of the inter-related set of codewords received as analog input 405.

In addition to applying the data decode algorithm, data decoding circuit 470 utilizes a shared layer processing circuit 439 that performs various calculations and/or tasks in relation to utilizing shared layer information included as part of the codewords included in the inter-related set of codewords received as analog input 405. In addition, data decoding circuit 470 utilizes a shared layer memory 438 to store interim information generated as part of processing shared layer information.

Turning to FIGS. 5a-5d, a graphical depiction of a staged decoding process implemented by data decoding circuit 471, shared layer memory 438, and shared layer processing circuit 439. Turning FIG. 5a, data decoding is applied to each of a number of codewords in the inter-related set of codewords occurring in a period indicated by a time line 596. In particular, data decoding circuit 470 applies the data decode algorithm to a first codeword in the inter-related set of codewords. The H-matrix used during application of the data decode algorithm is specific to the first codeword. This application of the data decode algorithm to the first codeword is represented by decoder A 555a and results in production of a partial syndrome value 557a. Partial syndrome value 557a is stored to shared layer memory 438 (represented as shared layer memory 561).

At some point in the future, data decoding circuit 470 applies the data decode algorithm to a second codeword in the inter-related set of codewords. The H-matrix used during application of the data decode algorithm is specific to the second codeword. This application of the data decode algorithm to the second codeword is represented by decoder B 555b and results in production of a partial syndrome value 557b. Partial syndrome value 557b is XORd using a circuit 561b with partial syndrome value 557a accessed from shared layer memory 561 resulting in a cumulative syndrome value (C_Min B) 559b that is stored to shared layer memory 561.

At some point in the future, data decoding circuit 470 applies the data decode algorithm to a third codeword in the inter-related set of codewords. The H-matrix used during application of the data decode algorithm is specific to the third codeword. This application of the data decode algorithm to the third codeword is represented by decoder C 555c and results in production of a partial syndrome value 557c. Partial syndrome value 557c is XORd using a circuit 561c with cumulative syndrome value (C_Min B) 559c accessed from shared layer memory 561 resulting in a cumulative syndrome value (C_Min C) 559c that is stored to shared layer memory 561.

At some point in the future, data decoding circuit 470 applies the data decode algorithm to a last codeword in the inter-related set of codewords. The H-matrix used during application of the data decode algorithm is specific to the last codeword. This application of the data decode algorithm to the last codeword is represented by decoder C 555n and results in production of a partial syndrome value 557n. Partial syndrome value 557n is XORd using a circuit 561n with cumulative syndrome value (C_Min C) 559c accessed from shared layer memory 561 resulting in a cumulative syndrome value (C_Min C) 559n that is stored to shared layer memory 561 as a full syndrome value. Where the data decoding processes all converge, the full syndrome value maintained in shared layer memory 561 will equal the defined syndrome value used in the original encoding described above in relation to FIGS. 2a-2b.

Figure 5A:
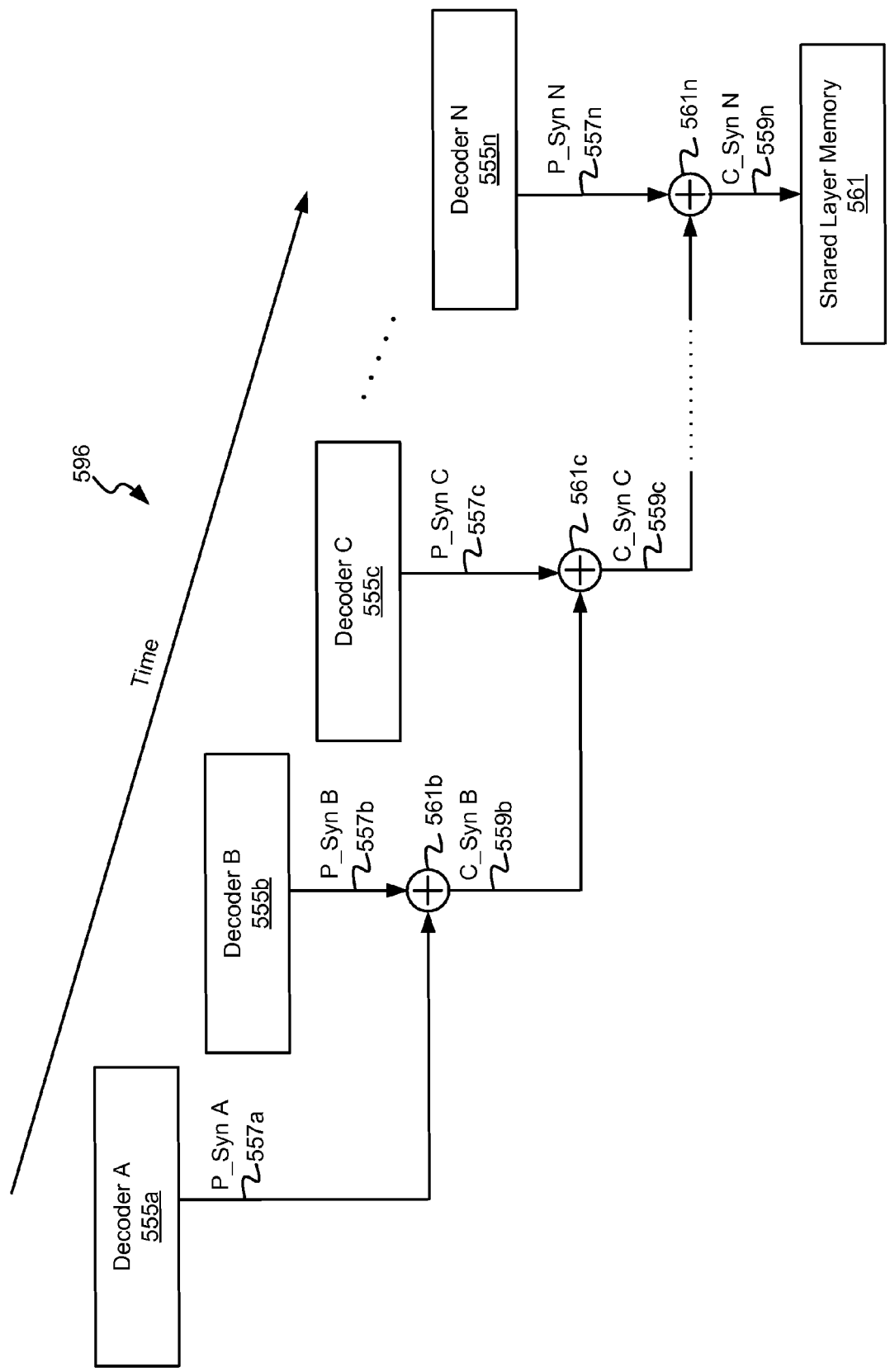
FIGS. 5a-5d graphically depict a staged decoding process implemented by a data decoding circuit including multi-sector H-matrix with shared layer circuitry.
Figure 5B:
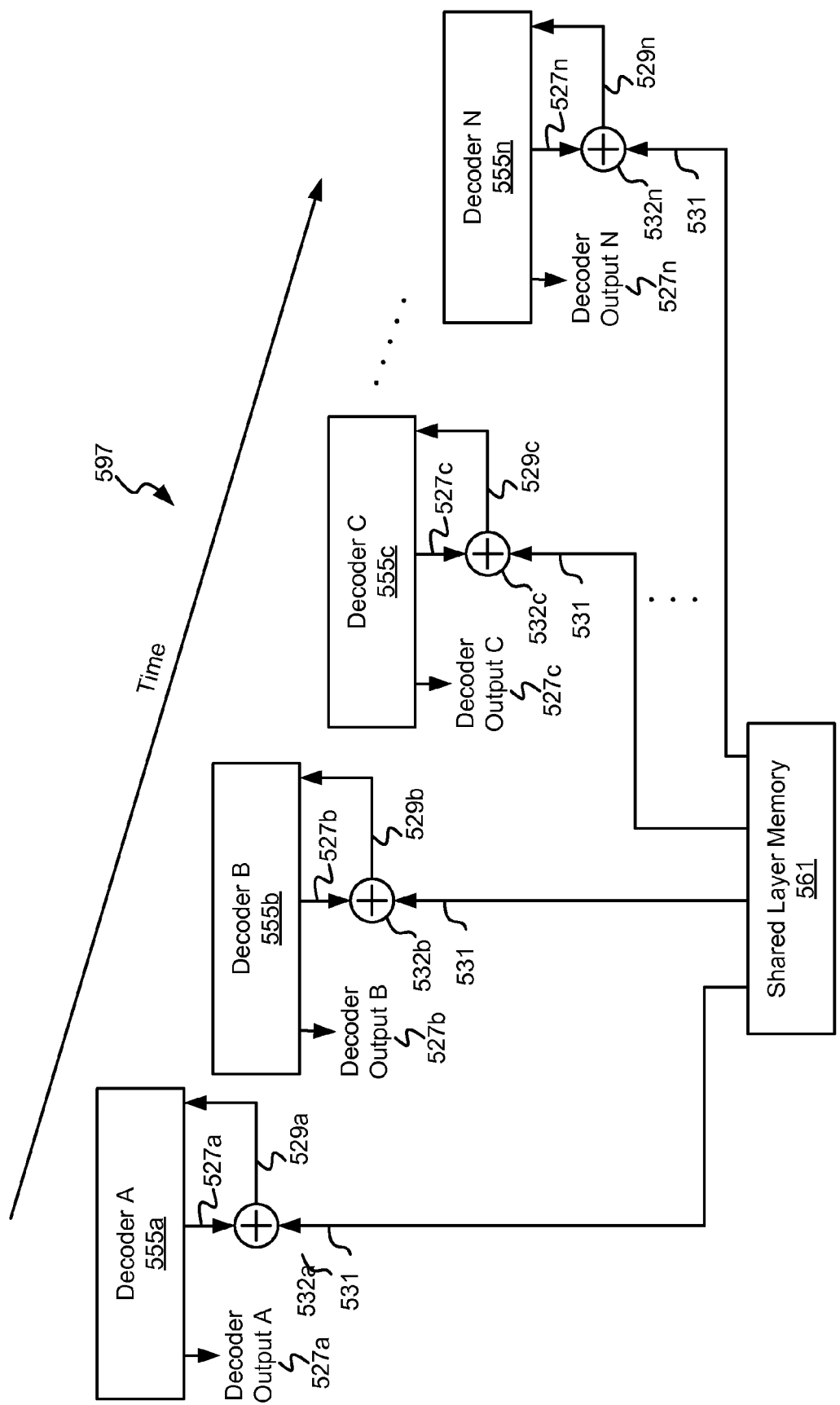

In a subsequent stage, hard messages are passed between decoder results. This is graphically depicted in FIG. 5b showing updating a feedback syndrome (D_Syn) in relation to each data decoding along a timeline 597. This feedback syndrome value is the hard message generated by application of the data decode algorithm to all of the other codewords linked by the shared layer. As shown along timeline 597, where application of the data decode algorithm to the respective codeword in the inter-related set of codewords fails to converge, a feedback syndrome for that particular codeword is generated by XORing the particular syndrome generated during the original decoding of the codeword with the full syndrome value generated as described in FIG. 5a and maintained in shared layer memory 561. Alternatively, if application of the data decode algorithm to the respective codeword in the inter-related set of codewords converges (i.e., the original data set is recovered), the process of updating the feedback syndrome for the given codeword is not done.

As shown, it is determined whether a decode output 527a generated by applying the data decode algorithm to the first codeword in the inter-related set of codewords converged. Where decode output 527a did not converge (i.e., errors remain) a feedback syndrome 529a is calculated by XORing the full syndrome 531 accessed from shared layer memory 561 with partial syndrome value 527a generated as part of applying the data decode algorithm using an XOR circuit 532a implemented as part of shared layer processing circuit 439. Similarly, it is determined whether a decode output 527b generated by applying the data decode algorithm to the second codeword in the inter-related set of codewords converged. Where decode output 527b did not converge (i.e., errors remain) a feedback syndrome 529b is calculated by XORing the full syndrome 531 accessed from shared layer memory 561 with partial syndrome value 527b generated as part of applying the data decode algorithm using an XOR circuit 532b implemented as part of shared layer processing circuit 439. Similarly, it is determined whether a decode output 527c generated by applying the data decode algorithm to the third codeword in the inter-related set of codewords converged. Where decode output 527c did not converge (i.e., errors remain) a feedback syndrome 529c is calculated by XORing the full syndrome 531 accessed from shared layer memory 561 with partial syndrome value 527c generated as part of applying the data decode algorithm using an XOR circuit 532c implemented as part of shared layer processing circuit 439. Finally, it is determined whether a decode output 527n generated by applying the data decode algorithm to the second codeword in the inter-related set of codewords converged. Where decode output 527n did not converge (i.e., errors remain) a feedback syndrome 529n is calculated by XORing the full syndrome 531 accessed from shared layer memory 561 with partial syndrome value 527n generated as part of applying the data decode algorithm using an XOR circuit 532n implemented as part of shared layer processing circuit 439. At the end of this process, a feedback syndrome value 529 is generated for each codeword that failed to converge upon application of the data decode algorithm.

The aforementioned processes discussed above in relation to FIGS. 5a-5b relate to generation of feedback syndrome values using hard decisions produced by application of the data decode information that include shared layer information. In contrast, the processes described in relation to FIGS. 5c-5d relate to another part of the decoding process that generates minimum path values based upon soft produced by application of the data decode information that include shared layer information. The minimum path values include a first minimum (min1 corresponding to the shortest path), a second minimum (min2 corresponding to the shortest path), and an index value (idx) as is known in the art. For convenience, each of the components of a minimum path value are designated by the following names: P_Min x.min1 for the first minimum, P_Min x.min2 for the second minimum, and P_Min x.idx for the index. Cumulative minimum path values are generated based upon other minimum path values and are designated by the following names: C_Min x.min1 for the first minimum, C_Min x.min2 for the second minimum, and C_Min x.idx for the index.

Figure 5C:
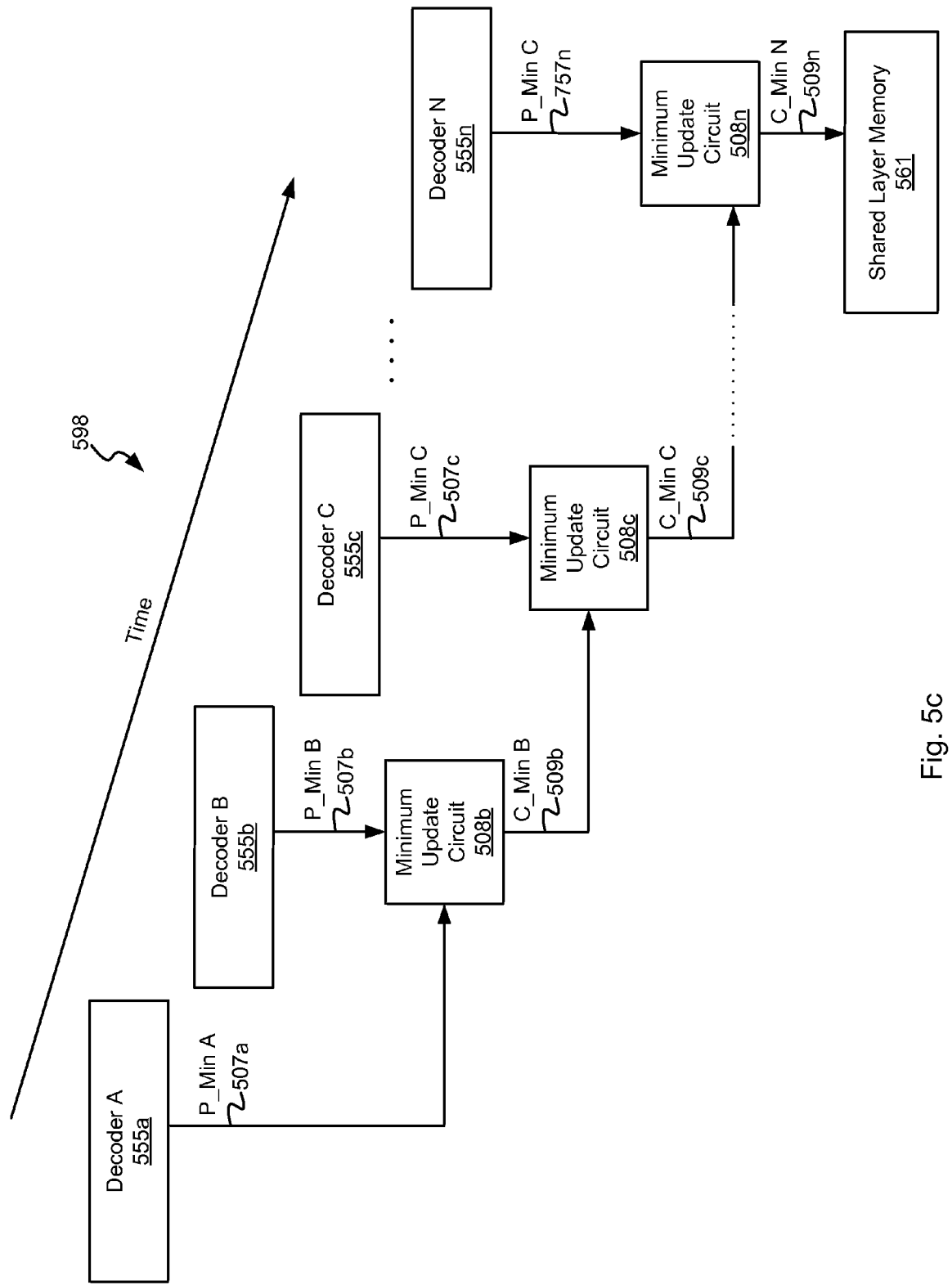

Turning to FIG. 5c, a process spanning a time period indicated by a timeline 598 is set forth. In particular, during application of the data decode algorithm by data decoding circuit 470 to the first codeword in the inter-related set of codewords, a minimum path value (P_Min A) 507a is generated and stored to shared layer memory 438 (represented as shared layer memory 561). Similarly, during application of the data decode algorithm by data decoding circuit 470 to the second codeword in the inter-related set of codewords, a minimum path value (P_Min B) 507b is generated and stored to shared layer memory 438 (represented as shared layer memory 561); during application of the data decode algorithm by data decoding circuit 470 to the third codeword in the inter-related set of codewords, a minimum path value (P_Min C) 507c is generated and stored to shared layer memory 438 (represented as shared layer memory 561); and during application of the data decode algorithm by data decoding circuit 470 to the last codeword in the inter-related set of codewords, a minimum path value (P_Min N) 507n is generated and stored to shared layer memory 438 (represented as shared layer memory 561).

A minimum update circuit 508b implemented as part of shared layer processing circuit 439 generates a cumulative minimum path value 509b based upon minimum path value 507a and minimum path value 507b in accordance with the following pseudocode:

```
C_Min B.min1 = the lesser of P_Min A.min1 and P_Min B.min1;
If (P_Min B.min 1 is the lesser of P_Min A.min1 and P_Min B.min1){
    C_Min B.min2 = the lesser of P_Min A.min1 and P_Min A.min2;
    C_Min B.idx = P Min B.idx
}
Else If (P_Min A.min 1 is the lesser of P_Min A.min1 and P_Min B.min1){
    C_Min B.min2 = the lesser of P_Min B.min2 and P_Min A.min2;
    C_Min B.idx = P_Min A.idx
}
```

A minimum update circuit 508c implemented as part of shared layer processing circuit 439 generates a cumulative minimum path value 509c based upon cumulative minimum path value 509b and minimum path value 507c in accordance with the following pseudocode:

```
C_Min C.min1 = the lesser of P_Min C.min1 and C_Min B.min1;
If (P_Min C.min1 is the lesser of P_Min C.min1 and C_Min B.min1){
    C_Min C.min2 = the lesser of C_Min B.min1 and C_Min B.min2;
    C_Min C.idx = P_Min C.idx
}
Else If (C_Min B.min1 is the lesser of P_Min C.min1 and C_Min
B.min1){
    C_Min C.min2 = the lesser of P_Min C.min2 and C_Min B.min2
    C_Min C.idx = C_Min B.idx
}
```

A minimum update circuit 508*n* implemented as part of shared layer processing circuit 439 generates a cumulative minimum path value 509*n* based upon cumulative minimum path value 509*c* and minimum path value 507*d* in accordance with the following pseudocode:

```
C_Min N.min1 = the lesser of P_Min D.min1 and C_Min C.min1;
If (P_Min D.min1 is the lesser of P_Min D.min1 and C_Min N.min1){
    C_Min N.min2 = the lesser of C_Min C.min1 and C_Min C.min2;
    C_Min N.idx = P_Min D.idx
}
Else If (C_Min C.min1 is the lesser of P_Min D.min1 and C_Min
C.min1){
    C_Min N.min2 = the lesser of P_Min D.min2 and C_Min C.min2
    C_Min N.idx = C_Min C.idx
}
```

The final cumulative minimum path value (C_Min N) is stored to shared layer memory 561.

Figure 5D:
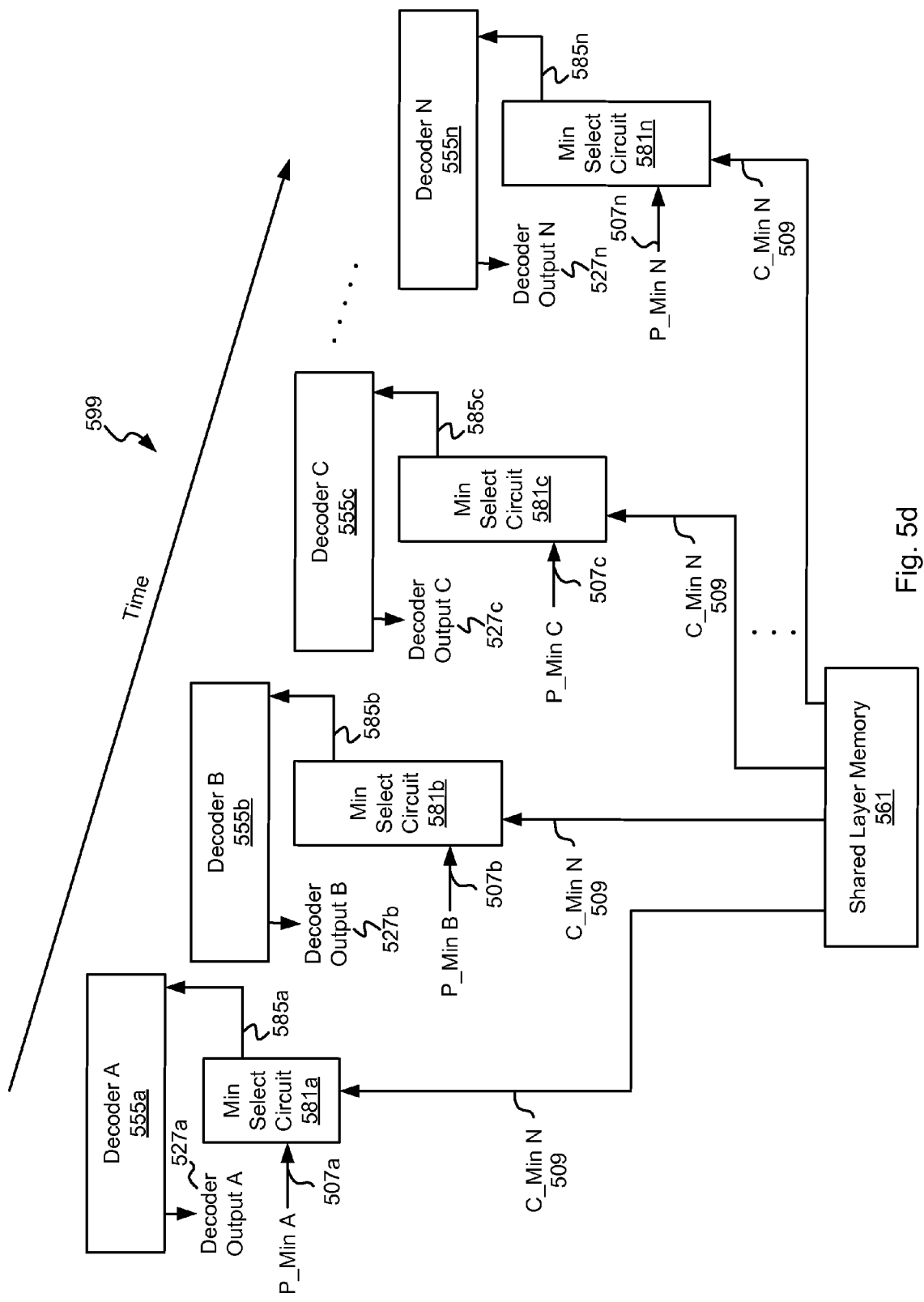

Turning to FIG. 5*d*, processes for generating a selected minimum feedback 585 using information generated from the other data decoder circuits (i.e., C_Min N) maintained in shared layer memory 561 are performed along a timeline 599 where the decoder output for each codeword in a data set in a multi-codeword data set including a shared layer.

It is determined whether a decode output A 527*a* generated by applying the data decode algorithm to the first codeword in the inter-related set of codewords converged. Where decode output A 527*a* did not converge (i.e., errors remain) it is determined whether min1 of P_Min A 507*a* (i.e., P_Min A.min1) generated by decoder A 555*a* is the same as min 1 of C_Min N 509 from shared layer memory 561 (i.e., C_Min N.min1 generated as discussed above in relation to FIG. 5*c*). Where P_Min A.min1 is the same as C_Min N.min1, then an selected minimum feedback 585*a* (D_Min A) is formed by min select circuit 581*a* in accordance with the following pseudocode:

```
If (C_Min_N.idx == A){
    D_Min A.min1 = C_Min N.min2
}
Else {
    D_Min A.min1 = C_Min N.min1
}
```

Selected minimum feedback 585*a* is provided to decoder A 555*a* for additional processing. Alternatively, where decode output A 527*a* did converge (i.e., the original data set was recovered), decoder output A 527*a* is provided as an output and the processes of min select circuit 581*a* are not performed.

Similarly, it is determined whether a decode output B 527*b* generated by applying the data decode algorithm to the first codeword in the inter-related set of codewords converged. Where decode output B 527*b* did not converge (i.e., errors remain) it is determined whether min1 of P_Min B 507*b* (i.e., P_Min B.min1) generated by decoder B 555*b* is the same as min 1 of C_Min N 509 from shared layer memory 561 (i.e., C_Min N.min1 generated as discussed above in relation to FIG. 5*c*). Where P_Min B.min1 is the same as C_Min N.min1, then an selected minimum feedback 585*b* (D_Min B) is formed by min select circuit 581*b* in accordance with the following pseudocode:

```
If (C_Min_N.idx == B){
    D_Min B.min1 = C_Min N.min2
}
Else {
    D_Min B.min1 = C_Min N.min1
}
```

Selected minimum feedback 585*b* is provided to decoder B 555*b* for additional processing. Alternatively, where decode output B 527*b* did converge (i.e., the original data set was recovered), decoder output B 527*b* is provided as an output and the processes of min select circuit 581*b* are not performed.

Similarly, it is determined whether a decode output C 527*c* generated by applying the data decode algorithm to the first codeword in the inter-related set of codewords converged. Where decode output C 527*c* did not converge (i.e., errors remain) it is determined whether min1 of P_Min C 507*c* (i.e., P_Min C.min1) generated by decoder C 555*c* is the same as min 1 of C_Min N 509 from shared layer memory 561 (i.e., C_Min N.min1 generated as discussed above in relation to FIG. 5*c*). Where P_Min C.min1 is the same as C_Min N.min1, then an selected minimum feedback 585*c* (D_Min C) is formed by min select circuit 581*c* in accordance with the following pseudocode:

```
If (C_Min_N.idx == C){
    D_Min C.min1 = C_Min N.min2
}
Else {
    D_Min C.min1 = C_Min N.min1
}
```

Selected minimum feedback 585*c* is provided to decoder C 555*c* for additional processing. Alternatively, where decode output C 527*c* did converge (i.e., the original data set was recovered), decoder output C 527*c* is provided as an output and the processes of min select circuit 581*c* are not performed.

Similarly, it is determined whether a decode output D 527*d* generated by applying the data decode algorithm to the first codeword in the inter-related set of codewords converged. Where decode output D 527*d* did not converge (i.e., errors remain) it is determined whether min1 of P_Min D 507*d* (i.e., P_Min D.min1) generated by decoder D 555*d* is the same as min 1 of C_Min N 509 from shared layer memory 561 (i.e., C_Min N.min1 generated as discussed above in relation to FIG. 5*c*). Where P_Min D.min1 is the same as C_Min N.min1, then an selected minimum feedback 585*d* (D_Min D) is formed by min select circuit 581*d* in accordance with the following pseudocode:

```
If (C_Min_N.idx == D){
    D_Min D.min1 = C_Min N.min2
}
```

```
    Else {
        D_Min D.min1 = C_Min N.min1
    }
```

Selected minimum feedback 585d is provided to decoder D 555D for additional processing. Alternatively, where decode output D 527d did converge (i.e., the original data set was recovered), decoder output D 527d is provided as an output and the processes of min select circuit 581d are not performed.

It should be noted that application of the data decode algorithm in FIGS. 5a-5d may be the same application of the algorithm with the processes done based upon the single application, or the data decode algorithm may be applied two or more times to implement the processes of FIGS. 5a-5d depending upon the particular implementation. Also, it should be reiterated that while FIGS. 5a-5d show the processing of four codewords together using shared layer data, that more or fewer codewords may be linked together by share layer data and thus more or fewer codewords may be processed together. In addition, it should be noted that application of the data decode algorithm in FIGS. 5a-5d may be the same application of the algorithm with the processes done based upon the single application, or the data decode algorithm may be applied two or more times to implement the processes of FIGS. 5a-5d depending upon the particular implementation. Error correction can now be applied on a codeword by codeword basis effectively using data from the shared layer. This error correction includes re-applying the data decode algorithm using the feedback syndrome 529 and selected minimum feedback 585 for each of the decoded outputs that failed to converge.

Referring again to FIG. 4, the process of data decoding discussed above in relation to FIGS. 5a-5d continues for a number of local iterations. Where the allowable number of local iterations completes without convergence of the codewords, the resulting decoded output is provided as a decoded output 454 back to central memory circuit 450 where it is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output converges (i.e., yields the originally written data set), the resulting decoded output is provided as an output codeword 472 to a de-interleaver circuit 480. De-interleaver circuit 480 rearranges the data to reverse both the global and local interleaving applied to the data to yield a de-interleaved output 482. De-interleaved output 482 is provided to a hard decision output circuit 490. Hard decision output circuit 490 is operable to re-order data sets that may complete out of order back into their original order. The originally ordered data sets are then provided as a hard decision output 492.

Figure 6A:
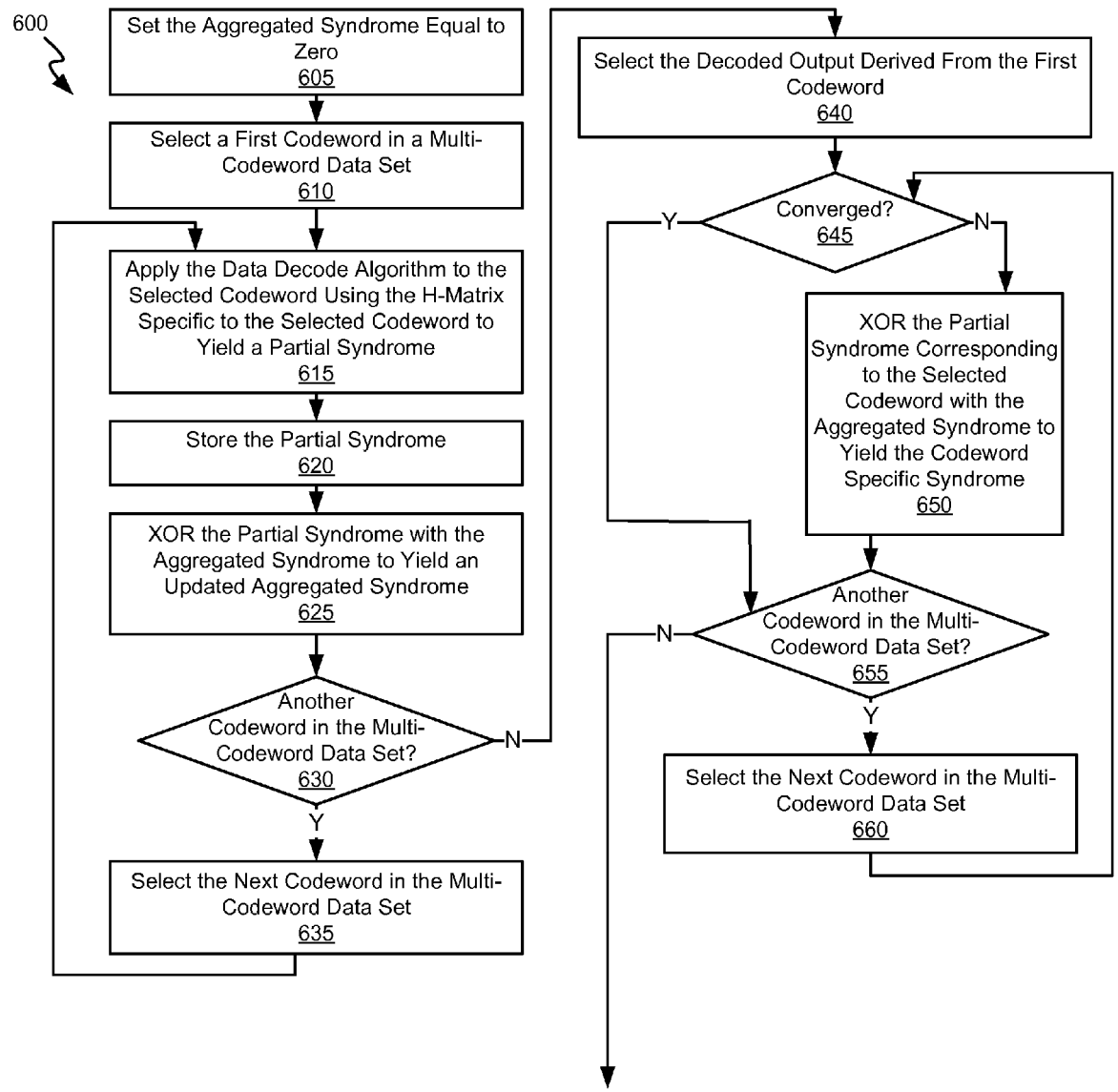
FIGS. 6a-6b are flow diagrams showing a method in accordance with one or more embodiments of the present invention for processing codewords encoded as multi-sector H-matrix with shared layer data sets.
Figure 6B:
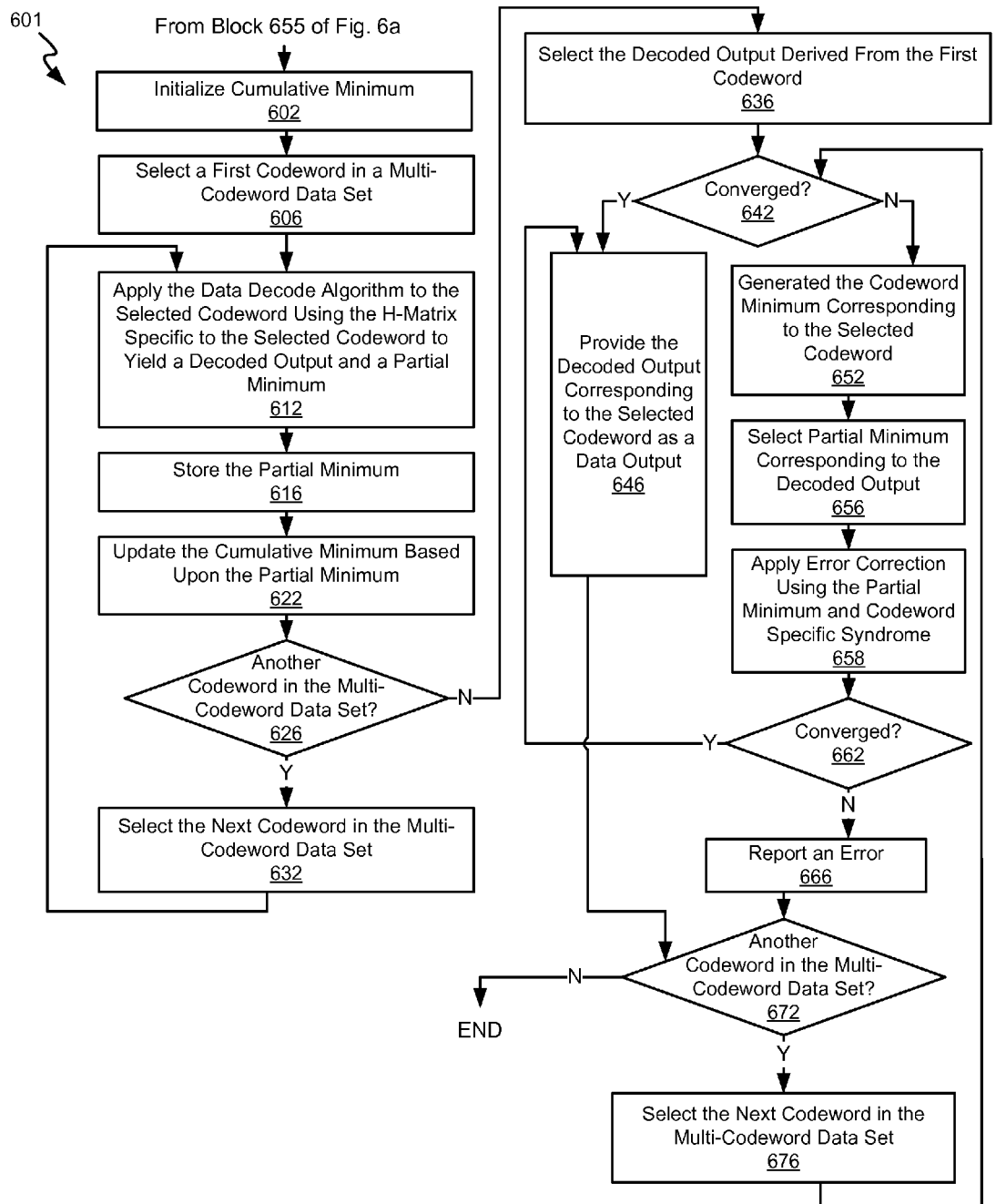

Turning to FIGS. 6a-6b, flow diagrams 600, 601 show a method in accordance with one or more embodiments of the present invention for processing codewords encoded as multi-sector H-matrix with shared layer data sets. Following flow diagram 600 of FIG. 6a, an aggregated syndrome value is set equal to zero (block 605). A first codeword in a multi-codeword data set is selected (block 610). The data decode algorithm is applied to the selected codeword using the H-matrix specific to the selected codeword to yield a partial syndrome value (block 615). The partial syndrome is then stored to a shared layer memory (block 620). The partial syndrome value maintained in the shared layer memory is XORd with the aggregated syndrome to yield an updated aggregated syndrome (block 625). This aggregated syndrome is stored back to the shared layer memory.

It is then determined whether another codeword in the multi-codeword data set remains to be decoded (block 630). Where another codeword remains to be decoded (block 635), the next codeword in the multi-codeword data set is selected (block 635) and the processes of blocks 615-635 are repeated for the next codeword.

Alternatively, where no additional codewords remain to be decoded (block 630), the decoded output derived from the first codeword is selected (block 640). It is determined whether the decoded output converged (i.e., all errors are corrected resulting in the original data set) (block 645). Where the decoder output failed to converge (block 645), the aggregated syndrome previously stored to the shared layer memory and representing a syndrome from all codewords in the multi-codeword data set is XORd with the partial syndrome generated as part of applying the decoding algorithm to the codeword for the currently queried decoded output. This XORing yields a codeword specific syndrome (i.e., a syndrome specific to the particular codeword)(block 650). The codeword specific syndrome is stored to the share layer memory for later use.

It is then determined whether another codeword remains in the multi-codeword data set (block 655). Where another codeword remains in the multi-codeword data set (block 655), the next codeword in the multi-codeword data set is selected (block 660), and the processes of blocks 645-660 are repeated for the next codeword. Alternatively, where no additional codewords remain in the multi-codeword data set (block 655), the process transitions to block 602 of FIG. 6b.

Following flow diagram 601 of FIG. 6b, a cumulative minimum is initialized (block 602) and a first codeword in a multi-codeword data set is selected (block 606). The data decode algorithm is applied to the selected codeword using the H-matrix specific to the selected codeword to yield a decoded output and a partial minimum (block 612). This partial minimum includes a min1 (i.e., the minimum distance in the trellis diagram), a min2 (i.e., the next minimum distance in the trellis diagram), and an index. This partial minimum is stored to the shared layer memory (block 616).

The cumulative minimum (C_Min x) is then updated based upon the partial minimum (P_Min x)(block 622). This updating is done in accordance with the following pseudocode, where x indicates the particular codeword and x−1 indicates the preceding values:

```
C_Min x.min1 = the lesser of P_Min x.min1 and C_Min x-1.min1;
If (P_Min x.min1 is the lesser of P_Min x.min1 and C_Min x-1.min1){
    C_Min x.min2 = the lesser of C_Min x-1.min1 and C_Min
```

```
    x-1.min2;
    C_Min x.idx = P_Min x.idx
}
Else If (C_Min x-1.min1 is the lesser of P_Min x.min1 and C_Min
x-1.min1){
    C_Min c.min2 = the lesser of P_Min c.min2 and C_Min x-1.min2
    C_Min c.idx = C_Min x-1.idx
}
```

It is then determined whether another codeword in the multi-codeword data set remains to be decoded (block 626). Where another codeword remains to be decoded (block 626), the next codeword in the multi-codeword data set is selected (block 632) and the processes of blocks 612-626 are repeated for the next codeword.

Alternatively, where no additional codewords remain to be decoded (block 626), the decoded output derived from the first codeword is selected (block 636). It is determined whether the decoded output converged (i.e., all errors are corrected resulting in the original data set) (block 642). Where the decoded output converged (block 642), the decoded output corresponding to the selected codeword is provided as a data output (block 646). Alternatively, where the decoded output failed to converge (block 642), the codeword minimum corresponding to the selected codeword is generated (block 652). Error correction is then applied using the partial minimum (block 656) and codeword specific syndrome (block 652)(block 658). This error correction includes re-applying the data decode algorithm using the partial minimum (block 656) and codeword specific syndrome (block 650) for the particular codeword in the multi-codeword data set. It is then determined whether the error correction resulted in correcting all of the remaining errors (block 662). Where the result converged (block 662), the decoded output corresponding to the selected codeword is provided as a data output (block 646). Alternatively, where the result converged (block 662), an error is reported (block 666). It is then determined whether another codeword in the multi-codeword data set remains to be decoded (block 672). Where no additional codewords remain to be processed, the local iteration of the decoder ends. Otherwise, where another codeword remains to be decoded (block 672), the next codeword in the multi-codeword data set is selected (block 676) and the processes of blocks 642-672 are repeated for the next codeword. It should be noted that the processes of FIGS. 6*a*-6*b* may be reduced to a single application of the data decode algorithm to each codeword that yields both cumulative minimums and codewords specific syndromes.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data encoder circuit, the data encoder circuit:
        receiving a data input that includes at least a first data set and a second data set;
        encoding the data input to yield a first encoded output and a second encoded output, wherein the first encoded output includes the first data set and a first encoded data, wherein the second encoded output includes the second data set and a second encoded data, and wherein the first encoded data and the second encoded data are generated from a combination of the first data set and the second data set;
        encoding the first encoded output to yield a first codeword, wherein the first codeword includes the first encoded output and a third encoded data unrelated to the second encoded output; and
        encoding the second encoded output to yield a second codeword, wherein the second codeword includes the second encoded output and a fourth encoded data unrelated to the first encoded output; and
    a data decoder circuit, the data decoder circuit:
        decoding the first codeword to yield a third encoded output and a fifth encoded data;
        decoding the second codeword to yield a fourth encoded output and a sixth encoded data; and
        wherein the third encoded output is different from the first encoded output, the data decoder circuit:
            generating a first feedback based at least in part upon the third encoded output and the fourth encoded output; and
            re-decoding the first codeword using the first feedback as a guide.

2. The data processing system of claim 1, wherein the data processing system is implemented as part of a storage device, and wherein the storage device comprises:
    a storage medium configured to store the first codeword and the second codeword.

3. The data processing system of claim 1, wherein the data processing system is implemented as part of an integrated circuit.

4. A data processing system, the data processing system comprising:
    a data encoder circuit configured to:
        receive a data input that includes at least a first data set and a second data set;
        encode the data set to yield a first encoded output and a second encoded output, wherein the first encoded output includes the first data set and a first encoded data, wherein the second encoded output includes the second data set and a second encoded data, and wherein the first encoded data and the second encoded data are generated from a combination of the first data set and the second data set;

encode the first encoded output to yield a first codeword, wherein the first codeword includes the first encoded output and a third encoded data unrelated to the second encoded output; and encode the second encoded output to yield a second codeword, wherein the second codeword includes the second encoded output and a fourth encoded data unrelated to the first encoded output.

5. The data processing system of claim 4, wherein the data processing system is implemented as part of an integrated circuit.

6. The data processing system of claim 4, wherein the data processing system is implemented as part of a device selected from a group consisting of:

a storage device, and a communication device.

7. The data processing system of claim 4, wherein the first encoded data is parity data is a first parity data and the second encoded data is a second parity data, wherein both the first parity data and the second parity data are generated based upon a combination of the first data set and the second data set.

8. A data processing system, the data processing system comprising:

a data decoder circuit configured to:
apply a data decode algorithm to a first codeword to yield a first encoded output and a first encoded data;
apply the data decode algorithm to a second codeword to yield a second encoded output and a second encoded data;
wherein the first encoded output includes an uncorrected error, the data decoder circuit is further configured to:
generate a first feedback based at least in part upon both the first encoded output and the second encoded output; and
re-decode the first codeword using the first feedback as a guide to correct the uncorrected error;
wherein the first encoded output includes a first data set and a third encoded data;
wherein the second encoded output includes a second data set and a fourth encoded output; and
wherein the third encoded data and the fourth encoded data are generated based upon an input data set including at least the first data set and the second data set.

9. The data processing system of claim 8, wherein generating the first feedback comprises:
calculating an overall syndrome value based at least in part upon both the first encoded output and the second encoded output;
calculating a codeword specific syndrome value by XORing a partial syndrome resulting from applying the data decode algorithm to the first codeword with the overall syndrome value; and
wherein the first feedback includes the codeword specific syndrome value.

10. The data processing system of claim 8, wherein generating the first feedback comprises:
generating a cumulative minimum value based at least in part upon both the first encoded output and the second encoded output;
selecting either a first minimum of the cumulative minimum value or a second minimum of the cumulative minimum value as a codeword minimum based at least in part on an equivalence between a decoder minimum resulting from applying the data decode algorithm to the first codeword is equivalent to the first minimum of the cumulative minimum value; and
wherein the first feedback includes the codeword minimum.

11. The data processing system of claim 10, wherein generating the first feedback further comprises:
calculating an overall syndrome value based upon the first encoded output and the second encoded output;
calculating a codeword specific syndrome value by XORing a partial syndrome resulting from applying the data decode algorithm to the first codeword with the overall syndrome value; and
wherein the first feedback further includes the codeword specific syndrome value.

12. The data processing system of claim 8, wherein the data decode algorithm is a low density parity check decode algorithm.

13. The data processing system of claim 8, wherein the data processing system is implemented as part of an integrated circuit.

14. The data processing system of claim 8, wherein the data processing system is implemented as part of a device selected from a group consisting of:

a storage device, and a communication device.

15. The data processing system of claim 8, wherein the data decoder circuit is further configured to:
generate a second feedback based at least in part upon both the first encoded output and the second encoded output; and
re-decode the second codeword using the second feedback as a guide to correct the uncorrected error.

16. The data processing system of claim 15, wherein generating the second feedback comprises:
calculating an overall syndrome value based upon the first encoded output and the second encoded output;
calculating a codeword specific syndrome value by XORing a partial syndrome resulting from applying the data decode algorithm to the second codeword with the overall syndrome value; and
wherein the first feedback includes the codeword specific syndrome value.

17. The data processing system of claim 15, wherein generating the second feedback comprises:
generating a cumulative minimum value based upon at least in part upon both the first encoded output and the second encoded output;
selecting either a first minimum of the cumulative minimum value or a second minimum of the cumulative minimum value as a codeword minimum based at least in part on an equivalence between a decoder minimum resulting from applying the data decode algorithm to the second codeword is equivalent to the first minimum of the cumulative minimum value; and
wherein the second feedback includes the codeword minimum.

18. The data processing system of claim 17, wherein generating the first feedback further comprises:
calculating an overall syndrome value based at least in part upon both the first encoded output and the second encoded output;
calculating a codeword specific syndrome value by XORing a partial syndrome resulting from applying the data decode algorithm to the second codeword with the overall syndrome value; and
wherein the second feedback further includes the codeword specific syndrome value.

19. The data processing system of claim 8, wherein the data processing system is implemented as part of a storage device, wherein the storage device comprises:
- a storage medium configured to maintain information representing both the first codeword and the second codeword;
- a head assembly disposed in relation to the storage medium and configured to provide a sensed signal corresponding to the information on the storage medium;
- a read channel circuit including:
    - an analog to digital converter circuit configured to sample an analog signal derived from the sensed signal to yield a series of digital samples;
    - an equalizer circuit configured to equalize the digital samples to yield the first codeword and the second codeword; and
    - an input buffer configured to maintain at least the first codeword and the second codeword.

20. The data processing system of claim 19, wherein the storage device further comprises:
- a data encoder circuit configured to:
    - receive a data input that includes at least a first data set and a second data set;
    - encode the data set to yield a third encoded output and a fourth encoded output, wherein the third encoded output includes the first data set and a first encoded data, wherein the fourth encoded output includes the second data set and a second encoded data, and wherein the first encoded data and the second encoded data are generated from a combination of the first data set and the second data set;
    - encode the third encoded output to yield the first codeword, wherein the first codeword includes the third encoded output and a third encoded data unrelated to the fourth encoded output; and
- encode the fourth encoded output to yield the second codeword, wherein the second codeword includes the fourth encoded output and a fourth encoded data unrelated to the third encoded output.

\* \* \* \* \*